United States Patent
Guimond et al.

(10) Patent No.: US 9,534,291 B2
(45) Date of Patent: Jan. 3, 2017

(54) DLC COATING WITH RUN-IN LAYER

(71) Applicant: OERLIKON TRADING AG, TRÜBBACH, Trübbach (CH)

(72) Inventors: Sebastien Guimond, St. Gallen (CH); Manfred Wurzer, Wittenbach (CH); Franz Widowitz, Feldkirch (AT)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 14/769,452

(22) PCT Filed: Feb. 10, 2014

(86) PCT No.: PCT/EP2014/000425
§ 371 (c)(1),
(2) Date: Aug. 20, 2015

(87) PCT Pub. No.: WO2014/127902
PCT Pub. Date: Aug. 28, 2014

(65) Prior Publication Data
US 2016/0017483 A1   Jan. 21, 2016

(30) Foreign Application Priority Data

Feb. 21, 2013  (DE) .................. 10 2013 002 911
Apr. 25, 2013  (DE) .................. 10 2013 007 146

(51) Int. Cl.
*C23C 16/02*    (2006.01)
*C23C 16/26*    (2006.01)
(Continued)

(52) U.S. Cl.
CPC ............ *C23C 16/26* (2013.01); *C09D 1/00* (2013.01); *C23C 16/006* (2013.01);
(Continued)

(58) Field of Classification Search
USPC ................................ 427/577; 428/336, 408
See application file for complete search history.

(56) References Cited

U.S. PATENT DOCUMENTS 5,900,289 A    5/1999  Hartmann et al.
5,942,317 A *  8/1999  White .................. C23C 14/027
                                                    428/336

(Continued)

FOREIGN PATENT DOCUMENTS

DE    29605666 U1    5/1996
DE    19544498 A1    6/1996
(Continued)

OTHER PUBLICATIONS

Z. Sun, et al., "Properties and Structures of Diamond-Like Carbon Film Deposited Using He, Ne, Ar/Methane Mixture by Plasma Enhanced Chemical Vapor Deposition," J. Appl. Phys., Jun. 1, 2000, pp. 8122-8131, vol. 87, No. 11.

(Continued)

*Primary Examiner* — Archene Turner

(57) ABSTRACT

A coating that resists wear; first, at least one DLC layer with a high degree of hardness is applied to a component and then a gradient layer, whose density decreases in the direction toward the surface, is applied to this DLC layer. By means of the hardness progression that this produces in the gradient layer, the gradient layer functions as a run-in layer in applications with sliding surfaces.

4 Claims, 2 Drawing Sheets

(51) Int. Cl.
  *C23C 16/00* (2006.01)
  *C23C 16/455* (2006.01)
  *C09D 1/00* (2006.01)
  *C23C 16/50* (2006.01)

(52) U.S. Cl.
  CPC .... *C23C 16/0272* (2013.01); *C23C 16/45523* (2013.01); *C23C 16/50* (2013.01)

(56) References Cited

U.S. PATENT DOCUMENTS

| | | | | |
|---|---|---|---|---|
| 6,299,425 | B1* | 10/2001 | Hirano | F01C 21/0809 428/408 |
| 7,160,616 | B2* | 1/2007 | Massler | C23C 16/029 427/577 |
| 7,427,439 | B2* | 9/2008 | Saito | C23C 16/029 428/408 |
| 7,458,585 | B2* | 12/2008 | Hamada | C10M 141/10 428/408 |
| 2002/0048638 | A1* | 4/2002 | Gruen | C23C 16/26 427/577 |
| 2007/0127158 | A1* | 6/2007 | Tran | G11B 5/718 360/134 |
| 2008/0264476 | A1 | 10/2008 | Sharps et al. | |
| 2009/0054277 | A1* | 2/2009 | Hamada | C10M 141/10 508/105 |
| 2011/0268946 | A1* | 11/2011 | Fischer | C23C 30/00 428/217 |
| 2011/0320006 | A1* | 12/2011 | Voisard | A61F 2/28 623/23.53 |

FOREIGN PATENT DOCUMENTS

| | | |
|---|---|---|
| DE | 19825983 A1 | 3/1999 |
| DE | 19825860 A1 | 12/1999 |
| DE | 102005063123 B3 | 5/2007 |
| DE | 102008011921 A1 | 9/2009 |
| EP | 1362931 B9 | 11/2003 |
| WO | 0047290 A1 | 8/2000 |

OTHER PUBLICATIONS

G.F. Zhang, et al., "Studies on Diamondlike Carbon Films for Antireflection Coatings of Infrared Optical Materials," J. Appl. Phys., Jul. 15, 1994, pp. 705-707, vol. 76, No. 2.

M. Stüber, et al., "Graded Layer Design for Stress-Reduced and Strongly Adherent Superhard Amorphous Carbon Films," Surface and Coatings Technology, 1999, pp. 591-598, vol. 116-119.

G.F. Zhang, et al., "Influence of Deposition Parameters on the Refractive Index and Growth Rate of Diamond-Like Carbon Films," Surface and Coatings Technology, 1994, pp. 127-130, vol. 64.

\* cited by examiner

DLC COATING WITH RUN-IN LAYER

FIELD OF THE INVENTION

The present invention relates to a method for producing a wear-resistant layer with a thick run-in layer.

BACKGROUND OF THE INVENTION

In components with sliding surfaces, there is a large need for hard surfaces that have a run-in layer as their outer layer so that the sliding counterpart element is initially able to at least partially wear away the run-in layer and thus produce an adaptation to its own geometry.

It is known to use DLC layers as sliding layers and to cover them with a softer layer so that this softer layer functions as a run-in layer. In this connection, however, it is disadvantageous that it is necessary to change over to another layer material. This places higher demands on the coating system and the coating procedure that is to be carried out.

The object of the present invention, therefore, is to disclose a hard surface coating with a soft run-in layer, where the layer materials of the hard coating and of the soft run-in layer are essentially the same with regard to their chemical elements and concentration.

SUMMARY OF THE INVENTION

This is achieved in that a gradient layer with a decreasing density and therefore decreasing hardness is produced on a DLC layer. With sufficient thickness of the gradient layer, this produces an efficient run-in layer.

It is clear here that due to the lower and decreasing density of the gradient layer, this leads to a reduction in the overall hardness of the layer. In a preferred embodiment, the gradient is implemented so that the overall hardness of the layer is not less than 15 GPa.

According to another preferred embodiment of the present invention, the DLC layer has a hardness that is not less than 1500 HV or 15 GPa, preferably not less than 18 GPa, and even more preferably not less than 20 GPa.

According to another preferred embodiment of the present invention, within the gradient layer thickness, there is no region that has a hardness of less than 600 HV or 6 GPa, preferably not less than 8 GPa.

According to another embodiment of the present invention, the thickness of the DLC layer is not less than 0.5 µm.

According to another embodiment of the present invention, the thickness of the gradient layer is not less than 300 nm.

A coating according to the present invention can, for example, be manufactured by means of plasma-supported CVD processes, PVD processes, or a combination of the two.

A preferred embodiment of the present invention for manufacturing layers includes a combined plasma-supported CVD and pulverization process.

The coating according to the present invention has the following advantages, among others:

The DLC layer remains hard enough in order to ensure wear resistance.

On substrates with an increased roughness, it is even possible to increase the wear resistance of the gradient layer since the regions between the peaks of substrate material are protected.

The manufacture of the gradient layer can be based on the conventional process for manufacturing the DLC layer. No additional equipment or additional gases are required.

The invention will now be explained by way of example in conjunction with a detailed description of the process.

DETAILED DESCRIPTION OF THE PREFERRED EMBODIMENTS

The substrates were produced in a vacuum chamber by means of a plasma-supported CVD method; a combination of acetylene and argon is used as the process gas. The process gas was ionized in the chamber by means of a plasma, which was produced by means of a low-voltage arc discharge. In addition, a substrate bias was applied to the substrates during the coating process.

In order to deposit the DLC layer, the substrate bias was kept at a constant value of 900 V. The DLC coating took 80 minutes. In order to deposit the gradient layer, the substrate bias was continuously reduced from 900 V to 50 V. After the passage of 40 minutes, a substrate bias of 50 V was reached. Aside from the substrate bias, the other coating parameters were kept constant during the entire coating process. The low-voltage arc discharge current, however, is continuously increased in order to counteract the decrease in the substrate current that occurs with a reduction of the substrate bias. This continuous reduction of the substrate bias produced a continuous reduction in the layer density, which in turn yielded a reduction in the layer hardness.

As a result, the gradient layer was 0.7 µm thick. The microindentation hardness for the entire system (DLC layer and gradient layer), measured at a load of 10 mN on a Fischerscope, was 18 GPa. The layer system demonstrated an excellent wear resistance.

Figure 1:
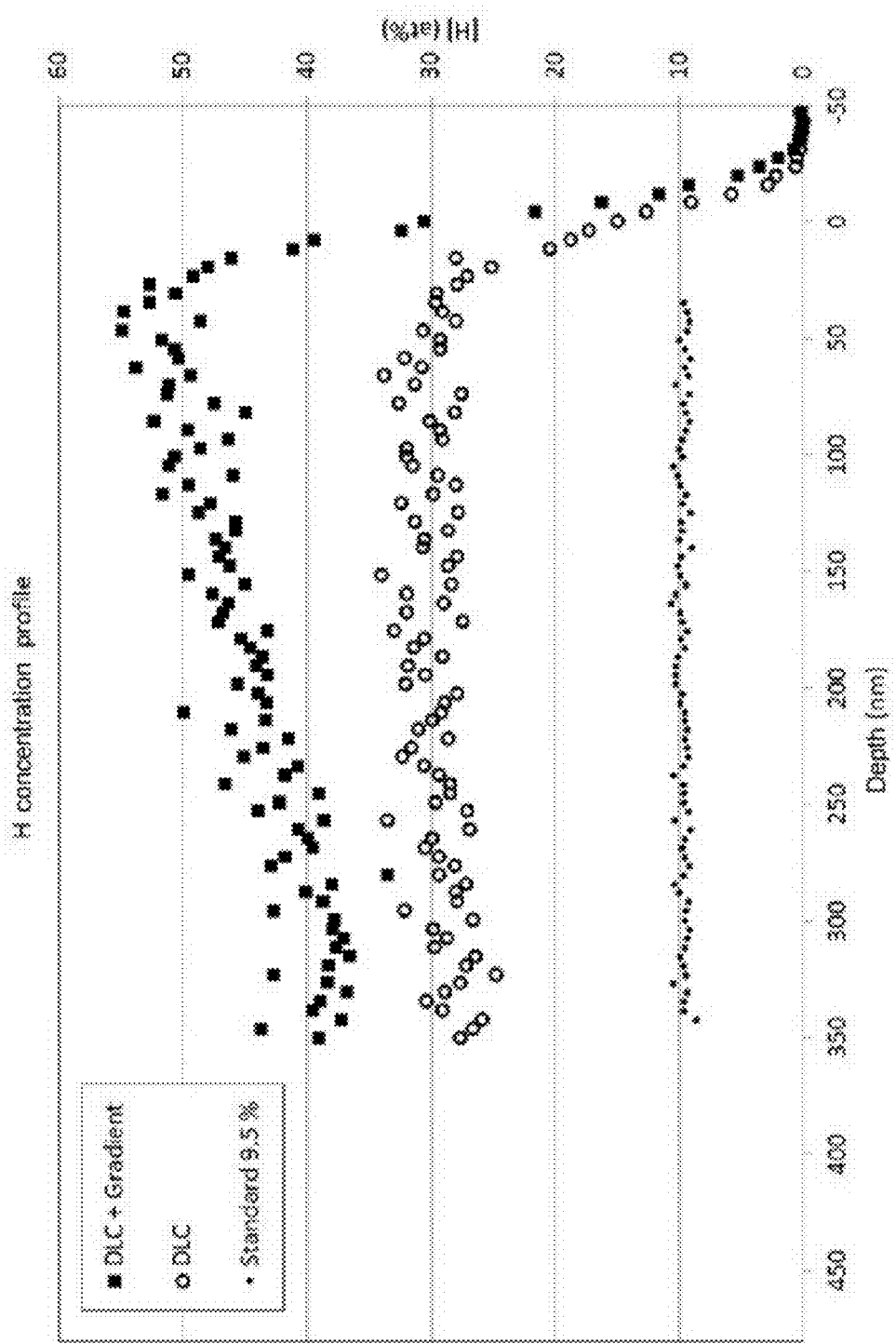
FIG. 1 shows the hydrogen concentration of different DLC samples in comparison to a reference.
Figure 2:
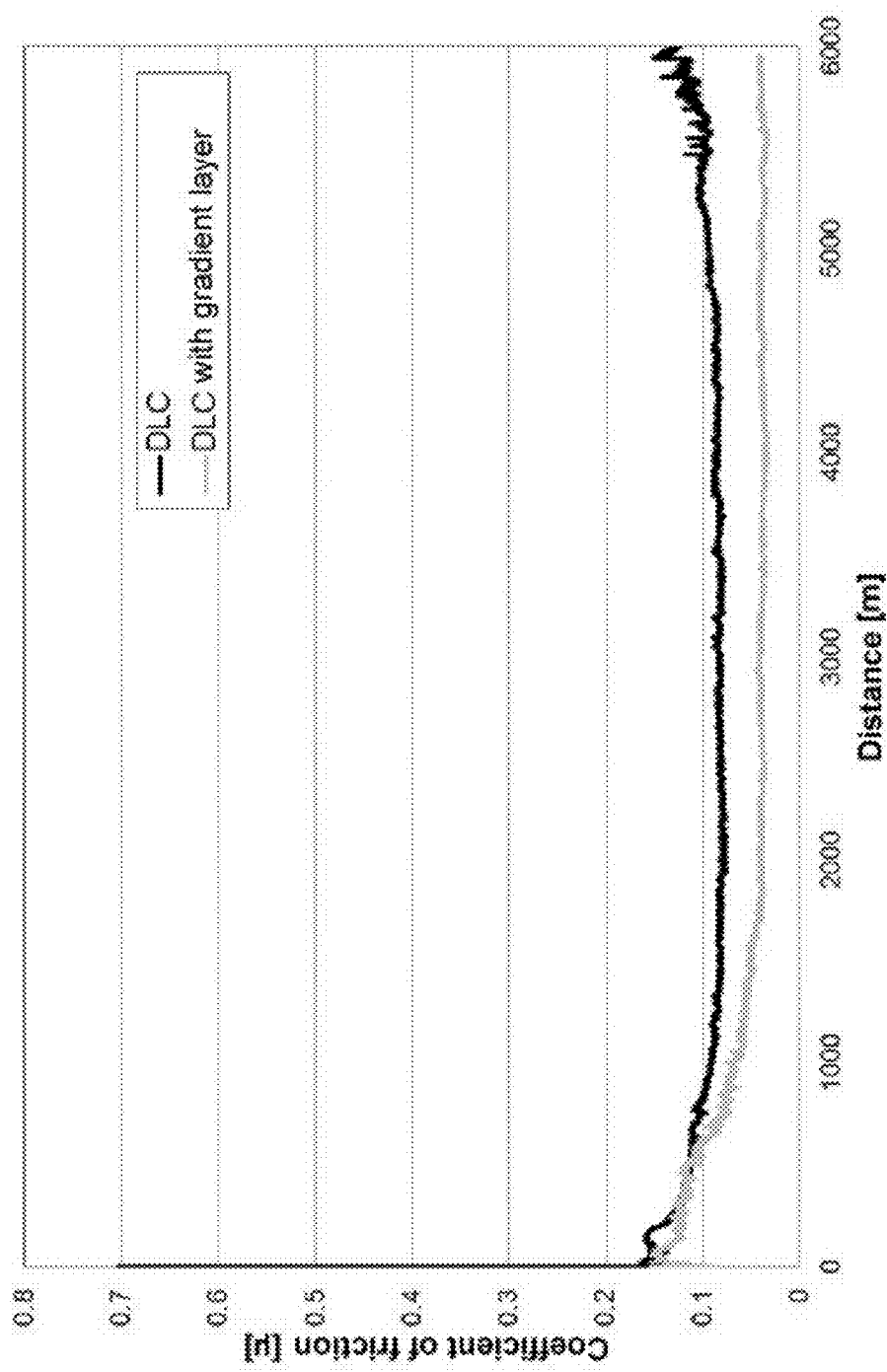
FIG. 2 shows the comparison of a DLC sample with a gradient and one without a gradient with regard to wear.

A depth profile of the concentration of hydrogen atoms ([H]) was determined for 2 DLC samples with 2 MeV He ERDA (elastic recoil detection analysis): one with a gradient and one without. In order to calculate the data, a standard with 9.5 at % H (mica) was measured as a reference and the energy loss (braking power) of the alpha particles in the DLC layers and in the standard was determined with the SRIM program (www.srim.org). The coating of the DLC layer without the gradient was carried out with a constant substrate bias of 900 V and took 80 minutes (layer thickness ~1 µm). In order to coat the DLC layer with gradient, the substrate bias was continuously reduced from 900 V to 50 V. This step took 80 minutes and resulted in a gradient layer thickness of 1.5 µm. The results are plotted in FIG. 1. This method makes it possible to measure down to a depth of approximately 350 nm. The surface is depicted in the profile at the right (0) and the depth scale increases toward the left. The results show that the concentration of hydrogen atoms increases toward the gradient surface. In the DLC sample without a gradient, however, the concentration of hydrogen atoms remains constant.

The friction of the DLC with the gradient layer was tested using the pin-on-disk test (pin-on-disk tribometer, CSM Instruments) and compared to DLC (without the gradient layer). The substrate was the same for both tests (polished steel plate). The test was performed in air at a temperature of 22° C. and 43% relative humidity. The samples were abraded against a 100Cr6 steel ball with a diameter of 3 mm. The steel ball served as a static friction partner and the coated sample was turned underneath it (radius 6 mm, speed 30 cm/s). A 30 N load was placed on the ball. Representative friction coefficients for the first 50 meters and after 6000 meters are plotted for both coatings in FIGS. 1a and b. It is clear that the friction coefficient for DLC with the gradient layer is significantly lower than that of DLC alone, particularly in the starting phase. The inspection of the abraded surfaces after the test also shows significantly less layer and counterpart component wear in general for DLC with the gradient layer than for DLC alone (width of the abrasion path on the coating 260 µm vs 450 µm, diameter of the abraded area on the ball 300 µm vs 600 µm).

In addition, the first field trials in the specific application successfully demonstrated the better run-in behavior of the DLC the gradient layer.

The invention claimed is:

1. A hard material layer on a component, the hard material layer comprising:
   a diamond-like carbon (DLC) layer with a hardness of at least 10 GPa; and
   a DLC gradient layer on top of the DLC layer, wherein the DLC gradient layer is at least 300 nm thick and the DLC gradient layer has a hydrogen concentration that increases toward a gradient surface.

2. The hard material layer according to claim 1, wherein a chemical composition of the gradient layer differs from a chemical composition of the DLC layer essentially only with regard to hydrogen content.

3. A method for manufacturing a wear-resistant surface, the method comprising:
   loading a coating chamber with substrates that are to be coated;
   pumping-out the coating chamber and introducing a process gas including acetylene and argon;
   producing a plasma using low-voltage arc discharge; and
   applying a substrate bias to the substrates that are to be coated,
wherein in order to deposit a DLC layer, first a high substrate bias is applied and for the subsequent coating of a gradient layer, the substrate bias is reduced continuously and/or with a plurality of small reduction steps.

4. The method according to claim 3, comprising continuously increasing a low-voltage discharge current, while reducing the substrate bias, in order to counteract a decrease in plasma density that accompanies the reduction of the substrate bias.

* * * * *